United States Patent [19]

McMenamin

[11] 4,393,013
[45] Jul. 12, 1983

[54] VAPOR MASS FLOW CONTROL SYSTEM

[75] Inventor: Joseph C. McMenamin, Fresno, Calif.

[73] Assignee: J. C. Schumacher Company, Oceanside, Calif.

[21] Appl. No.: 288,360

[22] Filed: Jul. 30, 1981

Related U.S. Application Data

[63] Continuation of Ser. No. 151,741, May 20, 1970, abandoned.

[51] Int. Cl.³ ............................................... B01F 3/04
[52] U.S. Cl. ............................... 261/64 B; 73/861.04; 137/101.25; 261/64 D; 261/128; 261/130; 261/DIG. 65
[58] Field of Search ............... 261/39 E, 64 B, 64 D, 261/121 R, 129, 142, DIG. 65, 128, 130; 215/32; 73/29, 861.04, 861.49; 137/88, 90, 101.25; 219/271–275

[56] References Cited

U.S. PATENT DOCUMENTS

| | | | |
|---|---|---|---|
| 3,095,463 | 6/1963 | Chang et al. | 137/101.25 X |
| 3,528,418 | 9/1970 | Grosholz et al. | 261/DIG. 65 |
| 3,583,685 | 6/1971 | Boerger et al. | 261/121 R X |
| 3,618,061 | 11/1971 | Livers | 73/29 |
| 3,650,151 | 3/1972 | Drexel | 73/861.04 |
| 3,823,728 | 7/1974 | Burris | 137/101.25 X |
| 4,051,886 | 10/1977 | Ross | 261/DIG. 65 |
| 4,134,514 | 1/1979 | Schumacher et al. | 215/32 X |
| 4,140,735 | 2/1979 | Schumacher | 261/22 |
| 4,220,460 | 9/1980 | Partus | 261/39 E X |
| 4,276,243 | 6/1981 | Partus | 261/DIG. 65 |

Primary Examiner—Richard L. Chiesa
Attorney, Agent, or Firm—Knobbe, Martens, Olson & Bear

[57] ABSTRACT

A system for precisely controlling the mass flow rate of vapor from a bubbler by a carrier gas stream.

9 Claims, 2 Drawing Figures

VAPOR MASS FLOW CONTROL SYSTEM

This application is a continuation, of application Ser. No. 151,741, filed May 20, 1980 now abandoned.

BACKGROUND OF THE INVENTION

This invention relates to an improved system for controlling the flow of vapor transported by a carrier gas from a bubbler to a using system. The control system is particularly useful in connection with high purity liquid source material used in the manufacturing of semiconductor devices.

The fabrication of semiconductor electronic devices includes many steps which require the transport of particular atoms or molecules to the surfaces of wafer substrates, usually maintained at elevated temperatures. In many of the steps, the most common method for accomplishing this is to transport the vapors from a liquid chemical source by a carrier gas stream into a reaction chamber of the using system. Consistent device performance depends strongly on accurate vapor delivery rates and extremely low levels of impurities, particularly metallics.

Typically, an ultra-high purity liquid source material is provided in a bubbler, and a suitable carrier gas stream is bubbled through the liquid and then transported to the point of use. The previous methods of vapor flow control that have been customarily used are the thermal-conductivity mass flow meter and the temperature controlled vaporizer bubbler; however, neither method has been entirely satisfactory.

The thermal conductivity mass flow meter monitors the vapor flow from a liquid source bubbler by taking the ratio of the thermal-conductivity of the carrier gas and vapor mixture flowing out of the bubbler, to the thermal-conductivity of the carrier gas flowing into the bubbler (see for example U.S. Pat. No. 3,650,151). The main drawback of this method is the introduction of metallic contamination in the vapor stream. The design and construction of the thermal mass flow meter has necessitated the use of metaliic parts, usually stainless steel, in the chemical vapor path. Because of the highly corrosive nature of many of the commonly used chemical vapors (especially in the presence of trace levels of moisture contamination) the metallic parts slowly deteriorate and the resulting metallic impurities are carried with the source vapor to the wafers. This leads not only to wafer contamination and low device yields, but also to drift and failure in the mass flow controller caused by the chemical deterioration. In addition the cost of the meters themselves is not a small problem in that they are costly, in the area of $2,000, and must be frequently repaired and replaced. This is particularly so with high carrier gas flow, such as in fiber optic applications.

The temperature controlled bubbler method maintains constant vapor mass flow by closely controlling the bubbler temperature and the mass flow rate of the carrier gas stream. Recently introduced improved bubblers, such as those illustrated in U.S. Pat. Nos. 4,134,514 and 4,140,735 eliminate many contamination and deterioration problems by using only high-purity quartz and teflon in contact with the vapors, and by eliminating chemical handling problems. The main drawback to this method has been fluctuations in the vapor mass flow such that the output has not always been sufficiently satisfactory and has required considerable trial and error adjusting of the carrier gas stream. As a result of inadequate controls, there is a significant and frequent loss of partially finished goods. In addition, there have been some reported instances of connections being broken or bubblers exploding because of improperly high pressures of the carrier gas streams. This results in danger to operating personnel because of the corrosive nature of the liquid source material, as well as the possible loss of the expensive work in progress, such as a batch of semiconductor wafers. Accordingly, a need exists for improved flow control of such a bubbler system. The present invention relates to such an improvement for the temperature controlled type bubbler system.

SUMMARY OF THE INVENTION

In the operation of temperature controlled bubbler systems, it had been assumed that maintaining a reasonably accurate control of the temperature of the liquid source material and monitoring the flow of the carrier gas would provide sufficient consistency of the vapor flow, since the saturation point of the carrier gas varies with temperature. However, close analysis has revealed a number of sources of error.

For example, it had been assumed that there was no need to monitor pressure in that the using system was at atmospheric pressure and that therefore the vapor pressure within the bubbler was essentially at atmospheric. It has been learned that simple changes in atmospheric pressure can produce an undesirable error in the vapor mass flow. Further, the existence of valves downstream from the bubbler can introduce back pressure variations such that the bubbler vapor pressure is above atmospheric pressure. Related to this, simply the length of the fluid line from the bubbler to the using system introduces variations in back pressure.

Also, it has been discovered that variation in the size of the opening through which the gas passes in exiting the bubbler can introduce pressure variations that result in a source of error. Typically, a thin glass seal in the bubbler inlet had been broken by magnetically raising a small metal ball and dropping it to break the seal. Variations in the size of the opening can affect the accuracy of the system, and use of the present invention accomodates such variations.

It has further been found that certain errors are introduced into the system by temperature variations that are not sufficiently accomodated by the means employed for maintaining the liquid source material at constant temperature. For example, sudden ambient temperature changes, such as that caused by opening a nearby oven door, can introduce temporary errors that cannot be quickly corrected by a temperature controller. Further, in some uses of the system such as the fabrication of fiber optics, a relatively large flow of carrier gas is required. It has been found that this increased carrier gas flow rate can introduce significant evaporative cooling such that ten to fifteen minutes may be required to stabilize the temperature. This of course results in the loss of very expensive bubbler vapor as well as delaying the manufacturing process.

Related to the high carrier gas flow rate situation, it was commonly thought that an increased flow rate would result in the carrier gas not being saturated as it bubbled through the liquid source material; however, while this is true with extremely high flow rates, analysis has shown that the rates in question do not result in inadequate saturation, but that instead variations are caused by some of the other sources of error referred to above.

The operation of the vapor mass flow controller of the present invention is based on the theory that accurate vapor mass flow from a liquid source bubbler can be obtained, if the temperature and pressure of the bubbler and the carrier gas mass flow are known. In addition to these factors, an empirically observed correction factor, depending on bubbler geometry, temperature, liquid level, and flow rate must be applied. It should be noted that the change in correction factor due to bubbler geometry is small enough that negligible change is for normal bubbler manufacturing tolerances, such that the correction factor normally only needs be determined for a particular design. This is important in that it makes the system more useful. The concept is mathematically expressed as follows:

$$\dot{m} = \frac{\alpha F_c}{p - P} \int \alpha (F_c, T, L)$$

where
 $\dot{m}$ = Vapor mass flow
 $F_c$ = Carrier gas mass flow
 p = Total bubbler pressure $\int \alpha (F_c, T, L)$ = Empirical correction factor T = Bubbler temperature
 L = Liquid level in bubbler
 $P = \delta_e(\beta - \gamma/T)$ = partial pressure of the chemical vapor; and $\alpha$, $\beta$, $\gamma$, and $\delta$ = constants for each chemical By using this formula and properly measuring the relevant parameters, temperature, pressure, level and carrier gas flow, an accurate determination of the vapor mass flow can be obtained. One or more of these parameters may be regulated through a feed back loop to control the vapor mass flow to any desired value within the available range of the parameters.

In a preferred example of the invention, changes in the variables are combined by an electronic flow controller which provides an output signal for adjusting the valve controlling the carrier gas flow, which provides the fastest adjustment speed. In addition, a signal is provided to a temperature controller for maintaining the bubbler temperature at a desired point. It has been found that with such a system, the accuracy of the vapor mass flow may be controlled to within one percent variation.

As additional features of the invention, the flow controller provides an alarm signal, if the level of liquid in the bubbler drops below a certain minimum required to obtain adequate saturation of the carrier gas. Additionally, the alarm indicates an overpressure condition and closes the input valve to interrupt the flow of carrier gas, if an overpressure condition should occur within the bubbler. A safety relief valve is also provided to relieve the pressure within the bubbler at a predetermined level.

DETAILED DESCRIPTION OF THE PREFERRED EMBODIMENT

Figure 1:
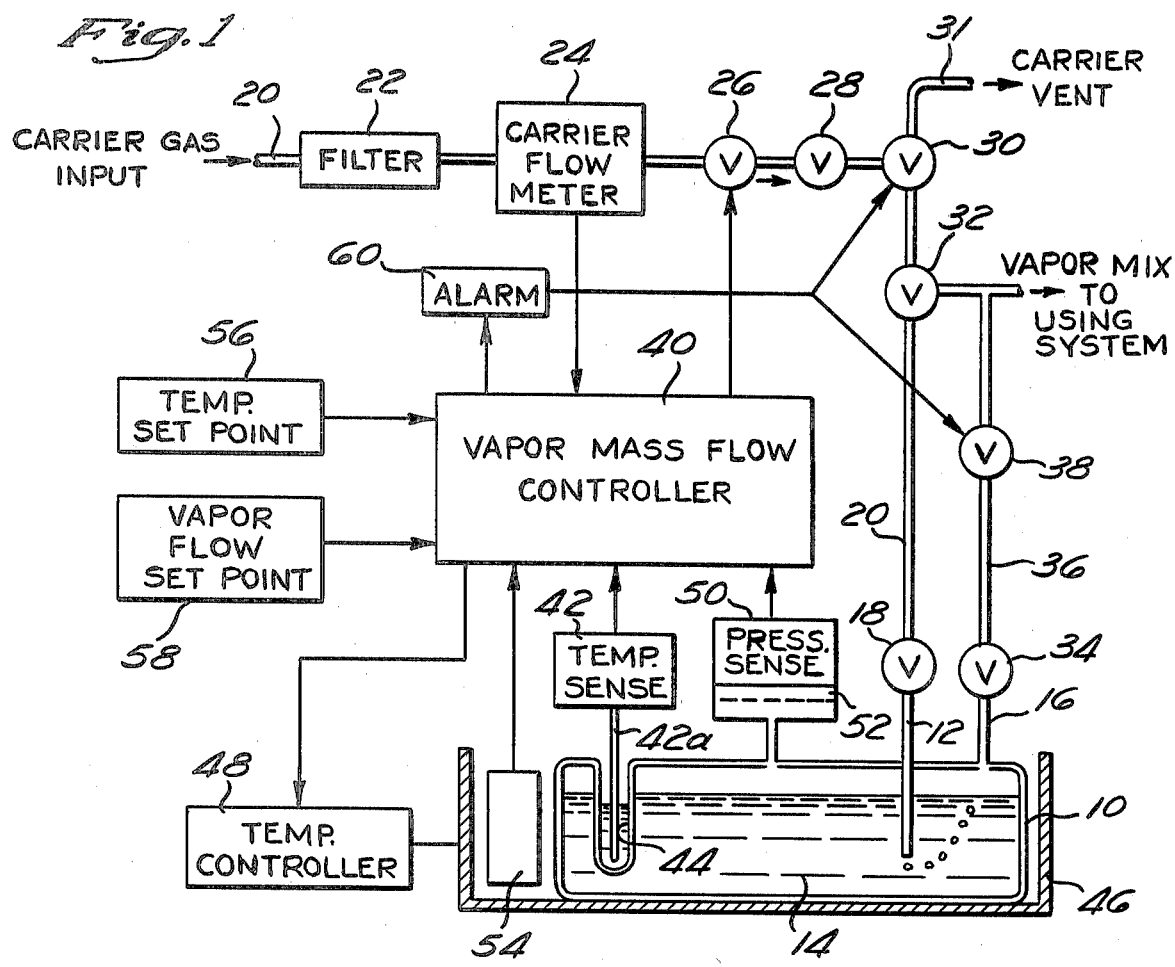
FIG. 1 is a block diagram indicating the overall arrangement and operation of the system.

Referring to FIG. 1, there is schematically illustrated a vaporizer bubbler 10 having an inlet tube 12 which enters through the upper wall of the bubbler and terminates at an open end near the bottom of the bubbler so that carrier gas exiting from the inlet tube will bubble upwardly through a quantity of liquid 14 within the bubbler container. The bubbler further has an outlet tube 16 in the upper wall of the bubbler in communication with the vapor space above the liquid in the bubbler. The bubbler is preferably made of high purity quartz material which will not react with the liquid or the carrier gas. Further details of two suitable bubblers may be obtained from U.S. Pat. Nos. 4,134,514 and 4,140,735.

The bubbler inlet tube is connected by a manually operated valve 18 to a carrier gas inlet line 20. The upper end of the inlet line is connected to a suitable carrier gas input source. Moving downstream from the carrier gas input, there is positioned a filter 22, a carrier gas flow meter 24, a carrier gas flow control valve 26, a check valve 28, a three-way vent valve 30, and a pressure relief valve 32.

The bubbler outlet tube 16 is connected by manually operated valve 34 to an outlet line 36 past a shut-off valve 38 for connection to a using system (not shown). A typical using system is a batch of semiconductor wafers in a furnace in which the bubbler liquid vapor is to be deposited at an elevated temperature.

A vapor mass flow controller 40 receives a variety of input information and provides an output signal for controlling the flow control valve 26. One input is the temperature of the bubbler liquid 14 as measured by a temperature sensor 42 which includes a probe 42a extending into a thin-walled well 44 formed in the bubbler. The probe makes good thermal contact with the well by means of a heat transfer fluid positioned within the well.

The bubbler is positioned in a container or shell 46 for maintaining the bubbler at a desired temperature. The temperature controller 48 connected to the vapor mass flow controller 40 provides heat or extracts heat, to the container 46 to monitor the bubbler at a desired level. Together, the container 46 and the controller 48 form a unit often referred to as a source-temperature controller (STC).

A pressure sensor or transducer 50 senses the pressure in the upper portion of the bubbler above the liquid and feeds a pressure input to the flow controller 40. The pressure transducer preferably includes an isolating diaphragm 52 which is exposed on one side to the bubbler interior, with the other side of the diaphragm confining a non-compressible fluid in the upper portion of the pressure sensor. The diaphragm 52 is preferably made of teflon or some other suitable material which can resist the chemicals to be confined within the bubbler, while not introducing any contamination into the source material.

A suitable sensor 54 senses the level of the liquid in the bubbler and provides a level input signal to the flow controller 40. The sensor provides information for calculating the vapor flow and for determining when the chemical supply is depleted. The level can be determined by knowing the starting level and keeping track in the mass flow controller of the total volume of vapor lost to the carrier gas stream. Another method which can be used is to sense the level by means of light emitting and detecting devices on the inner walls of the container 46.

Suitable means 56 is provided for furnishing temperature set point information to the flow controller 40. Similarly, means 58 provides a vapor flow set point value to the controller. Also, the carrier gas flow meter 24 is connected to provide carrier gas flow information to the controller. As an additional feature of the system, an alarm 60 is provided to receive a signal from the controller if certain undesired conditions should occur such as an overpressure condition in the bubbler or a lack of sufficient liquid in the bubbler. The alarm means 60 is further connected to the inlet and outlet valves 30 and 38.

Operation

In operation, the bubbler is first connected to the system as shown, the manually operated valves 18 and 34 being connected to the bubbler inlet and outlet tubes in a manner to prevent contamination with respect to the bubbler liquid. The details of one suitable manner for making connections to a bubbler are described in U.S. Pat. No. 4,134,514.

The temperature set point means 56 is adjusted to provide the desired temperature information to the controller 40. Similarly the desired vapor flow information is provided to the controller by the component 58. No pressure information need be provided by the user since the controller is preset for a standard of 760 millimeters of mercury. The temperature variation is relatively small with respect to a nominal temperature provided by the temperature set point means, and the pressure variation is also relatively small with respect to atmospheric pressure. Thus, the formula for computing the vapor mass flow, $\dot{m}$, can be simplified in the following approximate formula, which is essentially a four-dimensional linear approximation of the formula expressed above:

$$\dot{m}^* = AF_c(1 + B\Delta T - C\Delta P - DF_c + E\Delta L)$$

Figure 2:
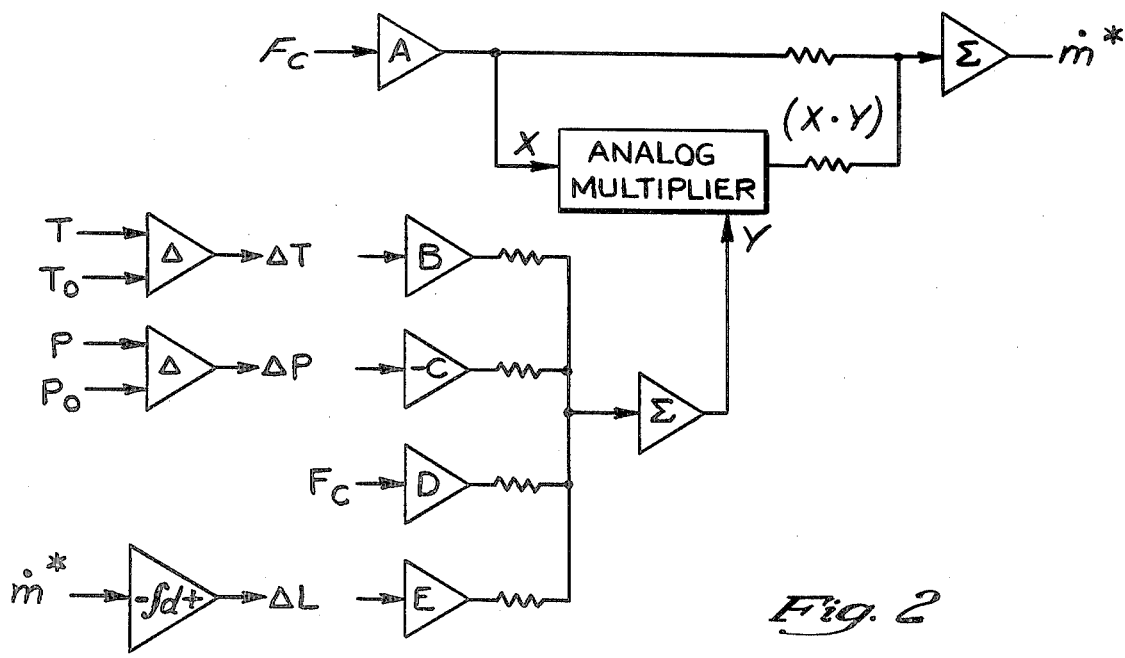
FIG. 2 is a block diagram indicating a mass flow approximation circuit of the electronic controller.

$\dot{m}^*$ = Approximate vapor mass flow
$F_c$ = Carrier gas mass flow
$\Delta T$ = Temperature variation from nominal = $(T - T_o)$
$\Delta P$ = Pressure variation from nominal = $(P - P_o)$
$\Delta L$ = Change in liquid level = $-\int \dot{m}^* dt$
A,B,C,D,E = Positive constants computed for each chemical and nominal operating conditions This approximate formula can be easily implemented in analogue or digital electronics obvious to one skilled in that art. However, to further assist in understanding the electronics required by the controller, refer to the block diagram of FIG. 2, which shows a mass flow approximation circuit. As can be seen, the variables in the system are amplified and combined to produce a multiplier for combining with the carrier gas mass flow to provide the approximate vapor mass flow. The electronics for such a system can be fabricated relatively inexpensively such that the controller becomes a very practical but yet highly accurate device.

Once the initial information has been fed to the controller and the bubbler is suitably connected to the system, the carrier gas is applied to the input line 20 with the vent valve 30 in open position so that the carrier gas is vented. After a short stabilization period, the valve 38 is opened, and the vent valve 30 moved to permit carrier gas flow into the bubbler. The valves 18 and 34 having been primarily employed to facilitate installation or removal of the bubbler without loss or contamination of chemicals. The system is then in operation; and as variations in the sensed parameters occur, the information is sent to the controller which instantly provides an output signal to the automatic flow control valve 26 to adjust the valve in a manner to maintain a uniform flow of the vaporized source material 14 transported from the bubbler by the carrier gas to the using system.

In a typical example of the system used in connection with the fabrication of semiconductors, the bubbler might contain POCl$_3$, at a pressure of 760 mmHg. An inert carrier gas, such as nitrogen is provided at a flow rate of 0 to 500 standard cubic centimeters per minute. A pressure variation, $\Delta P$ is likely to be within the range of $-50$ to $+152$ mHg, with an approximation error of less than 2 percent in its worst case. Because the bubbler temperature is controlled so that its deviation is small, and the pressure deviation is similarly generally small, the nominal operating conditions are well within the approximation range of the approximate linear formula expressed above, and therefore the approximation error is much less than one percent.

If an overpressure condition is detected by the alarm means 60, the input valve 30 closes, and the output valve 38 opens, if it was not already open, to eliminate the overpressure condition. If valve 38 was open, it is locked open to prevent it from being closed while the overpressure condition exists. Additional safety is afforded by the pressure relief valve 32 which vents to the vapor output to prevent bubbler explosion in case of valve failure. The check valve 28 prevents corrosive bubbler liquid from reaching the carrier flow meter.

The foregoing system provides a reliable and practical means for maintaining the accurate vapor mass flow which is necessary in many chemical processes, particularly that used in the fabrication of semiconductor devices.

What is claimed is:

1. A method for improving the accuracy in supplying a continuous uniform mass flow of vaporized material from a chemical vapor delivery system which includes a container partially filled with material to be vaporized and applied to a vapor using system, said container being at substantially atmospheric pressure, means for ducting a carrier gas through said material to transport said vaporized material, a valve for controlling the flow of said carrier gas to said container, and means for controlling the temperature of the material in said container, said method comprising:
   sensing the relatively small deviation from nominal atmospheric pressure of the total gaseous pressure in said container, which includes pressure variations therein caused by conditions downstream from the container;
   generating a signal utilizing said pressure deviation;
   transmitting said signal to said flow control valve, said signal adjusting said flow control valve to control the carrier gas flow to provide said continuous, uniform mass flow of said vaporized material with reduced error in said mass flow which would otherwise be caused by said pressure deviation.

2. The method of claim 1 including the steps of:
   sensing the temperature of said material to be vaporized,
   comparing said sensed temperature with a nominal temperature to determine a temperature differential;

generating a signal in a vapor mas flow controller utilizing said temperature differential in a computation by the controller which demands an increase in carrier gas flow in response to more negative differentials; and combining said temperature differential signal with said pressure differential signal to generate said signal for providing said continuous uniform mass flow of said vaporized material.

3. The method of claim 1 or 2 including:
sensing the level of said material in said container;
determining changes in said sensed levels;
combining said changes in said sensed levels with said pressure differential to generate said signal for providing said continuous uniform mass flow of said vaporized material to said using system.

4. In a chemical vapor delivery system including a container partially filled with material to be vaporized and applied to a using system, said container being at substantially atmospheric pressure, means for ducting a carrier gas through said material to transport said material in vaporized form, valve means for controlling the flow of said carrier gas, and means for sensing and controlling the temperature of said material in said container, the improvement for providing a continuous uniform mas flow of vapor to the using system comprising:

sensing the deviation from nominal atmospheric pressure of the total gaseous pressure in said container, which includes pressure variations therein caused by conditions downstream from the container, sensing the carrier gas flow rate, sensing the level of material in said container, and utilizing the sensed temperature, pressure, flow rate, and material level to control the valve means to provide continuous uniform vapor mass flow in accordance with the approximate formula:

$$\dot{m}^* = AF_c(1 + B\Delta T - C\Delta P - DF_c + E\Delta L)$$

wherein
$\dot{m}^*$ = Approximate vapor mass flow
$F_c$ = Carrier gas mass flow
$\Delta T$ = Temperature variation from nominal = $(T - T_o)$
$\Delta P$ = Pressure variation from nominal = $(P - P_o)$
$\Delta L$ = Change in liquid level = $\int \dot{m}^* \, dt$
A,B,C,D,E, = Positive constants computed for each chemical and nominal operating conditions.

5. A chemical vapor delivery system comprising:
a bubbler container for holding a quantity of high purity liquid to be vaporized and applied to a using system, said container being at substantially atmospheric pressure;
means for transporting a carrier gas through said liquid to transport the vaporized material to the using system;
means for sensing the carrier gas flow rate;
valve means for controlling the flow of said carrier gas;
means for sensing and controlling the temperature of said liquid;
means for sensing the total gaseous pressure in said container which includes pressure variations therein caused by conditions downstream from the container; and
controller means connected to receive the sensed carrier gas flow rate, the sensed temperature and the sensed pressure and to compare said sensed pressure with a reference pressure to provide a pressure differential indicative of a relatively small deviation from atmospheric pressure, said controller utilizing said pressure differential for reducing error in the mass flow rate of vapor which would otherwise be caused by said pressure deviation and producing a signal for controlling said carrier gas flow control valve means in a manner to produce a continuous, uniform mass flow of said vaporized liquid to said using system.

6. The apparatus of claim 5 including means for sensing the level of liquid in said container, means for providing input from said level sensing means to said controller means which utilizes the changes in level of said liquid in determining the signal to be provided to said flow control valve means.

7. The apparatus of claim 5 including means linked to said controller for interrupting flow of carrier gas into said container at a predetermined pressure.

8. The apparatus of claim 7 further including alarm means linked to said controller for providing an alarm signal if the flow of carrier gas into said bubbler container is interrupted.

9. The apparatus of claim 7 including means for relieving pressure applied to said container at a predetermined pressure by venting said carrier gas to said using system.

* * * * *